United States Patent
Wu et al.

(10) Patent No.: US 9,647,423 B2
(45) Date of Patent: May 9, 2017

(54) FLIP CHIP TYPE LASER DIODE AND LATERAL CHIP TYPE LASER DIODE

(71) Applicant: PlayNitride Inc., Tainan (TW)

(72) Inventors: Chih-Ling Wu, Tainan (TW); Yu-Yun Lo, Tainan (TW)

(73) Assignee: PlayNitride Inc., Tainan (TW)

(*) Notice: Subject to any disclaimer, the term of this patent is extended or adjusted under 35 U.S.C. 154(b) by 0 days.

(21) Appl. No.: 14/983,565

(22) Filed: Dec. 30, 2015

(65) Prior Publication Data

US 2016/0111855 A1 Apr. 21, 2016

Related U.S. Application Data

(63) Continuation-in-part of application No. 14/732,802, filed on Jun. 8, 2015, now Pat. No. 9,257,813.

(30) Foreign Application Priority Data

Jun. 20, 2014 (TW) .............................. 103121393 A (51) Int. Cl.
| | |
|---|---|
| *H01S 3/00* | (2006.01) |
| *H01S 5/042* | (2006.01) |
| *H01S 5/22* | (2006.01) |
| *H01S 5/02* | (2006.01) |
| *H01S 5/024* | (2006.01) |
| *H01S 5/223* | (2006.01) |
| *H01S 5/022* | (2006.01) |

(52) U.S. Cl.
CPC .......... *H01S 5/0425* (2013.01); *H01S 5/0217* (2013.01); *H01S 5/0224* (2013.01); *H01S 5/02461* (2013.01); *H01S 5/02476* (2013.01); *H01S 5/02484* (2013.01); *H01S 5/0421* (2013.01); *H01S 5/22* (2013.01); *H01S 5/2235* (2013.01); *H01S 5/02236* (2013.01); *H01S 5/2231* (2013.01)

(58) Field of Classification Search
CPC .... H01S 5/0425; H01S 5/2231; H01S 5/2235; H01S 5/22; H01S 5/02461; H01S 5/02484
USPC ...................................... 372/38.05, 34, 43.01
See application file for complete search history.

(56) References Cited

U.S. PATENT DOCUMENTS

| | | | |
|---|---|---|---|
| 5,689,124 A | 11/1997 | Morikawa et al. | |
| 9,413,135 B2 * | 8/2016 | Wu ...................... | H01S 5/0224 |

(Continued)

*Primary Examiner* — Kinam Park
(74) *Attorney, Agent, or Firm* — Jianq Chyun IP Office (57) ABSTRACT

A flip chip type laser diode includes a removable substrate, a first semiconductor layer, an emitting layer, a second semiconductor layer, at least one current conducting layer, a patterned insulating layer, at least one first electrode and a second electrode. The first semiconductor layer is disposed on the removable substrate. The emitting layer is disposed on a part of the first semiconductor layer. The second semiconductor layer is disposed on the emitting layer and forms a ridge mesa. The current conducting layer is disposed on a part of the first semiconductor layer. The patterned insulating layer covers the first semiconductor layer, the emitting layer, a part of the second semiconductor layer and a part of the current conducting layer. The first electrode and the second electrode are disposed on areas of the current conducting layer and the second semiconductor layer which are not covered by the patterned insulating layer.

13 Claims, 5 Drawing Sheets

(56) References Cited

U.S. PATENT DOCUMENTS

2011/0007761 A1* 1/2011 Assefa ............... G02B 6/12004
372/34
2013/0292719 A1* 11/2013 Lee ........................ H01L 33/08
257/93

* cited by examiner

FLIP CHIP TYPE LASER DIODE AND LATERAL CHIP TYPE LASER DIODE

CROSS-REFERENCE TO RELATED APPLICATION

This application is a continuation-in-part application of and claim the priority benefit of U.S. application Ser. No. 14/732,802, filed on Jun. 8, 2015, now allowed, which claims the priority benefit of Taiwan application serial no. 103121393, filed on Jun. 20, 2014. The entirety of each of the above-mentioned patent applications is hereby incorporated by reference herein and made a part of this specification.

BACKGROUND OF THE INVENTION

1. Field of the Invention

The invention relates to a laser diode, and particularly relates to a laser diode having better efficiency.

2. Description of Related Art

Figure 1:
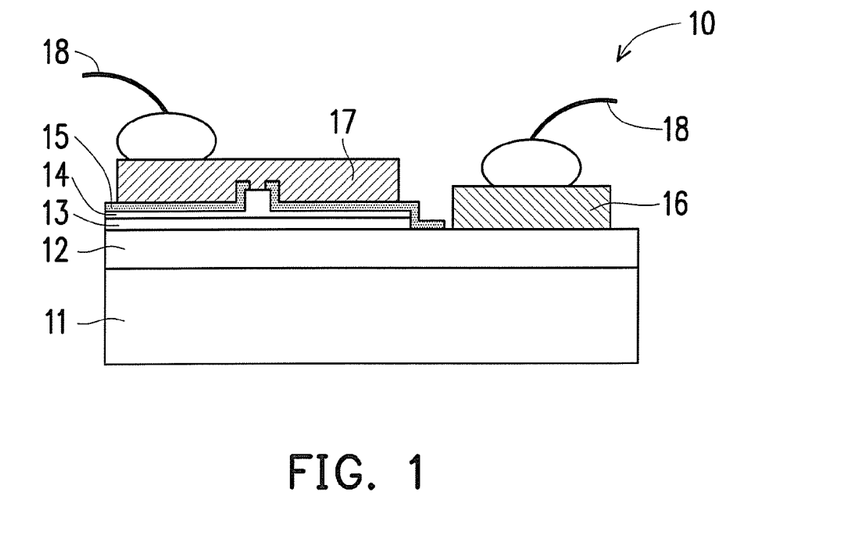
FIG. 1 is a cross-sectional schematic view illustrating a conventional laser diode.

FIG. 1 is a cross-sectional schematic view illustrating a conventional laser diode. Referring to FIG. 1, a conventional laser diode 10 includes a substrate 11, a first semiconductor layer 12, an emitting layer 13, a second semiconductor layer 14, a patterned insulating layer 15, a first electrode 16, a second electrode 17, and two conductive wires 18. The first semiconductor layer 12 is disposed on the substrate 11. The emitting layer 13 is disposed on a part of the first semiconductor layer 12. The second semiconductor layer 14 is disposed on the emitting layer 13 and forms a ridge mesa. The patterned insulating layer 15 covers a part of the second semiconductor layer 14. The first electrode 16 is disposed on the first semiconductor layer 12, the second electrode 17 is disposed on an area of the second semiconductor layer 14 that is not covered by the patterned insulating layer 15, and one end of each of the conductive wires 18 respectively extend from the first electrode 16 and the second electrode 17.

As shown in FIG. 1, the conventional laser diode 10 is electrically connected to an external part through bonding wire. Due to the consideration of cost, non-metal substrates such as a sapphire substrate, for example, may be chosen as the substrate 11. However, the laser diode using this kind of substrate has difficulty in releasing heat generated during an operation from a substrate end or a bonding wire end, which may result in undesirable heat dissipation performance, and thus influence a working efficiency of the laser diode.

SUMMARY OF THE INVENTION

The invention provides a laser diode having a desirable heat dissipation performance.

A flip chip type laser diode according to the embodiments of the invention includes a removable substrate, a first semiconductor layer, an emitting layer, a second semiconductor layer, at least one current conducting layer, a patterned insulating layer, at least one first electrode, and a second electrode. The first semiconductor layer is disposed on the removable substrate. The emitting layer is disposed on a part of the first semiconductor layer. The second semiconductor layer is disposed on the emitting layer and forms a ridge mesa. The at least one current conducting layer is disposed on a part of the first semiconductor layer. In addition, the at least one current conducting layer is electrically connected with the first semiconductor layer and isolated from the second semiconductor layer. The patterned insulating layer covers the first semiconductor layer, the emitting layer, the second semiconductor layer, and the current conducting layer, and exposes a part of the second semiconductor layer and parts of the current conducting layers. The first electrode is disposed on an area of the current conducting layer that is not covered by the patterned insulating layer. The second electrode is disposed on an area of the second semiconductor layer that is not covered by the patterned insulating layer.

According to an embodiment of the invention, the number of the at least one current conducting layer is two, and the two current conducting layers are located at two sides of the ridge mesa.

According to an embodiment of the invention, the number of the at least one first electrode is two, and the two first electrodes are located at two sides of the second electrode.

According to an embodiment of the invention, the removable substrate is a non-conductive substrate.

According to an embodiment of the invention, a size of the second electrode is greater than a size of each of the first electrode.

According to an embodiment of the invention, the second electrode covers the second semiconductor layer and a part of the patterned insulating layer, and the part of the patterned insulating layer covers a part of the first semiconductor layer and a part of the at least one current conducting layer.

According to an embodiment of the invention, an area of the at least one current conducting layer that is not covered by the patterned insulating layer is away from the ridge mesa.

According to an embodiment of the invention, a part of an area of the patterned insulating layer above the at least one current conducting layer is removed to display a specific letter string or symbol.

According to an embodiment of the invention, the at least one first electrode and the second electrode are electrically connected with a package substrate, and the package substrate includes a second substrate and a first patterned conductive layer located at one side of the second substrate.

According to an embodiment of the invention, the first patterned conductive layer includes at least one third electrode and a fourth electrode, the at least one third electrode contacts the at least one first electrode, and the fourth electrode contacts the second electrode.

According to an embodiment of the invention, the package substrate includes a second patterned conductive layer located at the other side of the second substrate, the second patterned conductive layer includes a fifth electrode and a sixth electrode, the second substrate has a plurality of through vias, making the at least one third electrode electrically connected to the fifth electrode, and the fourth electrode electrically connected to the sixth electrode.

According to an embodiment of the invention, a first surface of the at least one first electrode away from the at least one current conducting layer and a second surface of the second electrode away from the second semiconductor layer are approximately coplanar.

A flip chip type laser diode according to the embodiments of the invention comprises a first semiconductor layer, an emitting layer, a second semiconductor layer, at least one current conducting layer, a patterned insulating layer, at least one first electrode, a second electrode and a package substrate. The emitting layer is disposed on a part of the first semiconductor layer. The second semiconductor layer is disposed on the emitting layer and forming a ridge mesa. The at least one current conducting layer is disposed on a part of the first semiconductor layer, wherein the at least one current conducting layer is electrically connected with the first semiconductor layer and isolated from the second semiconductor layer. The patterned insulating layer covers the first semiconductor layer, the emitting layer, the second semiconductor layer, and the at least one current conducting layer, and exposes a part of the second semiconductor layer and a part of the at least one current conducting layer. The at least one first electrode, disposed on an area of the at least one current conducting layer that is not covered by the patterned insulating layer. The second electrode is disposed on an area of the second semiconductor layer that is not covered by the patterned insulating layer, wherein the at least one first electrode and the second electrode are electrically connected with the package substrate.

A lateral chip type laser diode according to the embodiments of the invention comprises a removable substrate, a first semiconductor layer, an emitting layer, a second semiconductor layer, at least one current conducting layer, a patterned insulating layer, at least one first electrode and a second electrode. The first semiconductor layer is disposed on the removable substrate. The emitting layer is disposed on a part of the first semiconductor layer. The second semiconductor layer is disposed on the emitting layer and forming a ridge mesa. The at least one current conducting layer is disposed on a part of the first semiconductor layer, wherein the at least one current conducting layer is electrically connected with the first semiconductor layer and isolated from the second semiconductor layer. The patterned insulating layer covers the first semiconductor layer, the emitting layer, the second semiconductor layer, and the at least one current conducting layer, and exposes a part of the second semiconductor layer and a part of the at least one current conducting layer. The at least one first electrode is disposed on an area of the at least one current conducting layer that is not covered by the patterned insulating layer. The second electrode is disposed on an area of the second semiconductor layer that is not covered by the patterned insulating layer. A first surface of the at least one first electrode away from the at least one current conducting layer and a second surface of the second electrode away from the second semiconductor layer are approximately coplanar.

Based on the above, the flip chip type laser diode according to the embodiments of the invention may be bonded to the package substrate through the first and second electrodes through direct bonding. A material having a preferable heat dissipation property may be chosen for the second substrate of the package substrate, such that the heat generated by the flip chip type laser diode may be transmitted to the package substrate through the second electrode having a greater area, thereby improving a heat dissipation efficiency. In addition, the flip chip type laser diode according to the embodiments of the invention is designed to dispose the current conducting layers at the two sides of the ridge mesa, such that the currents may flow toward the two sides to be evenly transmitted with a low resistance. The working efficiency is thus improved. Moreover, the electrodes of flip chip type laser diode according to the embodiments of the invention are designed to approximately coplanar to reduces the issue of disconnection and tilt, and the device reliability is consequently improved efficiently. In additional, a lateral chip type laser diode according to the embodiments of the invention whose electrodes are designed to approximately coplanar is provided, such that the bonding defect-free rate is improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the preferred embodiments of the invention, examples of which are illustrated in the accompanying drawings. Wherever possible, the same reference numbers are used in the drawings and the description to refer to the same or like parts.

Figure 2:
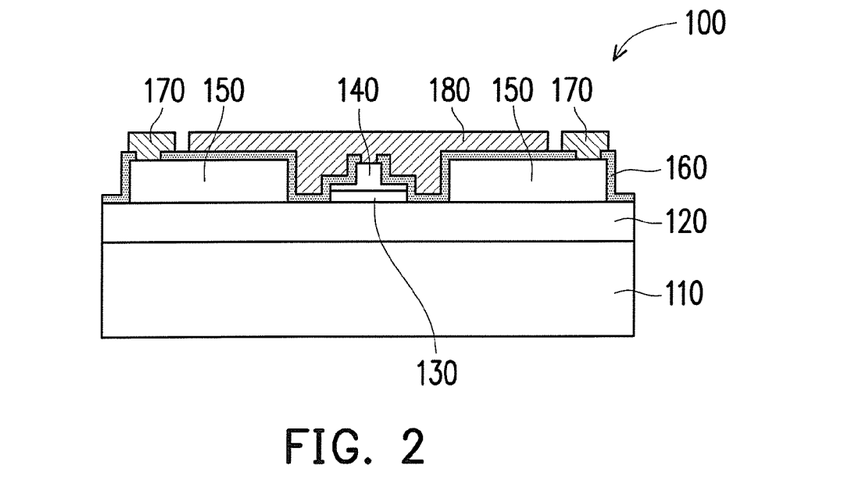
FIG. 2 is a cross-sectional schematic view illustrating a laser diode according to an embodiment of the invention.

FIG. 2 is a cross-sectional schematic view illustrating a laser diode according to an embodiment of the invention. Referring to FIG. 2, a laser diode 100 of this embodiment includes a removable substrate 110, a first semiconductor layer 120, an emitting layer 130, a second semiconductor layer 140, at least one current conducting layer 150, a patterned insulating layer 160, at least one first electrode 170, and a second electrode 180. In the embodiment, the laser diode 100 is flip chip type laser diode for a flip chip type bonding method, but in other embodiment, the laser diode 100 also can be a lateral chip type laser diode for another bonding method such as wire bonding. This is not limited thereto.

In this embodiment, the removable substrate 110 is a non-conductive substrate, and is a sapphire substrate, for example. However, the removable substrate 110 may be other kinds of substrates, such as a substrate made of Si, $SiO_2$, GaN, AlN, spinel, SiC, GaAs, $Al_2O_3$, $LiGaO_2$, $LiAlO_2$, or $MgAl_2O_4$, etc. However, the removable substrate 110 is not limited thereto. In the embodiment, the removable substrate 110 can be selected to remove. The removing method of the removable substrate 110 can be laser lift off technology (LLO) or chemical mechanical polishing technology (CMP), but the removing method of the removable substrate 110 is not limited thereto.

The first semiconductor layer 120 is disposed on the removable substrate 110. In this embodiment, the first semiconductor layer 120 is an N-type semiconductor layer. The emitting layer 130 is disposed on a part of the first semiconductor layer 120. As shown in FIG. 2, the emitting layer 130 is disposed on a center position of the first semiconductor layer 120. The second semiconductor layer 140 is disposed on the emitting layer 130 and forms a protruding ridge mesa. In this embodiment, the second type semiconductor layer 140 is a P-type semiconductor layer.

The at least one current conducting layer 150 is disposed on a part of the first semiconductor layer 120. In this embodiment, the at least one current conducting layer 150 includes two current conducting layers 150. The current conducting layers 150 are respectively disposed at two sides of the ridge mesa. The current conducting layers 150 are electrically connected to the first semiconductor layer 120 and isolated from the second semiconductor layer 140. In this embodiment, each of the current conducting layers 150 covers a large area of an area of the first semiconductor layer 120 that is not covered by the emitting layer 130.

The patterned insulating layer 160 covers the first semiconductor layer 120, the emitting layer 130, the second semiconductor layer 140, and the current conducting layer 150, and exposes a part of the second semiconductor layer 140 and parts of the current conducting layers 150. More specifically, the patterned insulating layer 160 exposes a top surface of the ridge mesa of the second semiconductor layer 140 and a small area of each of the current conducting layers 150, and covers rest of the second semiconductor layer 140, the first semiconductor layer 120 between the second semiconductor layer 140 and each of the current conducting layers 150, and a most of each of the current conducting layers 150. In this embodiment, the area of each of the current conducting layers 150 that is not covered by the patterned insulating layer 160 is away from the ridge mesa. In other words, the area of the current conducting layer 150 shown at the left side of FIG. 2 that is not covered by the patterned insulating layer 160 is close to the left, and the area of the current conducting layer 150 shown at the right side of FIG. 2 that is not covered by the patterned insulating layer 160 is close to the right.

The at least one first electrode 170 is disposed on the area of current conducting layer 150 that is not covered by the patterned insulating layer 160. In other words, the at least one first electrode 170 is disposed in the small area of the current conducting layer 150 away from the ridge mesa. In addition, in this embodiment, the number of the first electrode 170 is the same as the number of the current conducting layer 150. In other words, there are two first electrodes 170 respectively disposed on the areas of the current conducting layers 150 away from each other.

The second electrode 180 is located between the first electrodes 170. In this embodiment, a size of the second electrode 180 is greater than the size of each of the first electrodes 170. The second electrode 180 is disposed on the area of the second semiconductor layer 140 that is not covered by the patterned insulating layer 160 to be electrically connected with the second semiconductor layer 140. Specifically, the second electrode 180 is disposed on the top surface of the ridge mesa of the second semiconductor layer 140, and extends along the patterned insulating layer 160 toward the two sides of the patterned insulating layer 160 to reach areas above the current conducting layers 150. In addition, a distance is kept between the first electrodes 170.

In this embodiment, a flip chip design allows the first electrodes 170 and the second electrode 180 to be directly bonded to a package substrate (e.g., the package substrate 20 shown in FIG. 5), such that heat generated during operation of the flip chip type laser diode 100 may be transmitted to the package substrate. A material of the package substrate may be a material having a high thermal conductivity, such as MN, to help the flip chip type laser diode 100 dissipate the heat. Moreover, as shown in FIG. 2, a first surface (an upper surface) of the first electrodes 170 away from the current conducting layer 150 and a second surface (an upper surface) of the second electrode 180 away from the second semiconductor layer 140 are approximately coplanar. Due to the coplanar design of the first surface of the first electrodes 170 and the second surface of the second electrode 180, the flip chip type laser diode 100 can be bonded to the package substrate (e.g., the package substrate 20 shown in FIG. 5) without tilt. Therefore, the bonding defect-free rate of the flip chip type laser diode 100 and the package substrate can be improved. In addition, laser emitting direction of flip chip type the laser diode 100 also can be controlled more accurately. In other embodiment which the laser diode 100 is a lateral chip type laser diode, the design of coplanar of the electrodes can also enhance the the bonding defect-free rate.

In addition, since the heat generated during the operation of the flip chip type laser diode 100 is accumulated at the ridge mesa, the flip chip type laser diode 100 of this embodiment is deliberately designed to dispose the area of each of the current conducting layers 150 that is not covered by the patterned insulating layer 160 at a position away from the ridge mesa, such that the second electrode 180 may extend toward the sides and have a greater size. In this way, the heat may be transmitted out of the flip chip type laser diode 100 through the second electrode 180 having a large area. However, in other embodiments, the area of each of the current conducting layers 150 that is not covered by the patterned insulating layer 160 is not limited thereto.

Besides, in this embodiment, the current conducting layers 150 are connected to the first semiconductor layer 120 and is disposed at two sides of the emitting layer 130 and the second semiconductor layer 140. Therefore, currents may flow toward the two sides to be evenly transmitted with a low resistance. Therefore, a device efficiency is improved. The flip chip type laser diode 100 of this embodiment is not connected to the package substrate through bonding wire, so the issue of disconnection is reduced, and a device reliability is thus improved.

Figure 3:
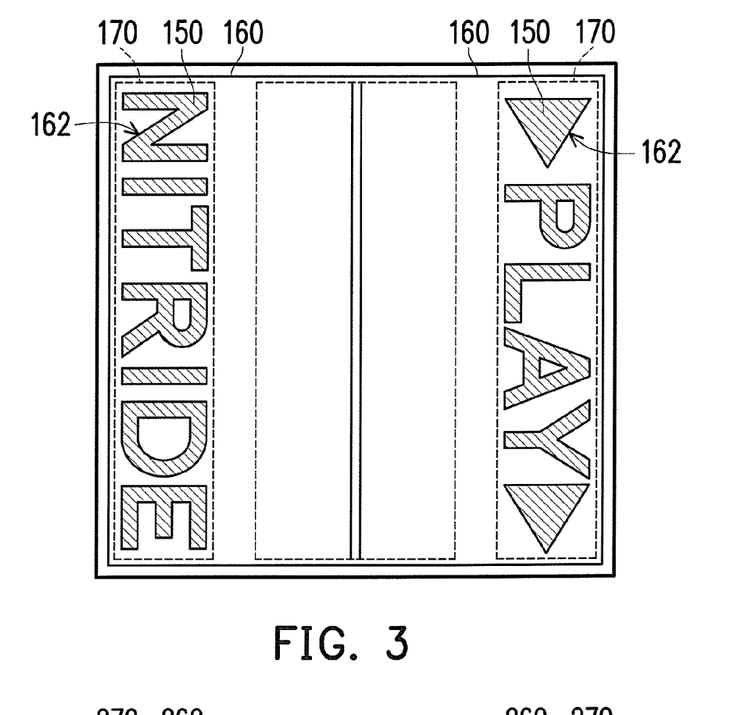
FIG. 3 is a top schematic view of a patterned insulating layer of the flip chip type laser diode shown in FIG. 2.

FIG. 3 is a top schematic view of a patterned insulating layer of the flip chip type laser diode shown in FIG. 2. Referring to FIG. 3, positions of the first electrodes 170 and the second electrode 180 are represented with broken lines in FIG. 3. Parts of areas of the patterned insulating layer 160 corresponding to the positions of the first electrodes 170 are removed to form hollow areas 162. Therefore, the current conducting layers 150 therebelow are exposed by the hollow areas 162 of the patterned insulating layer 160 to display a specific letter string or symbol that is made hollow by the hollow areas 162. For example, the specific letter string may be adapted to indicate specific information or a laser emitting direction of the flip chip type laser diode 100.

Figure 4:
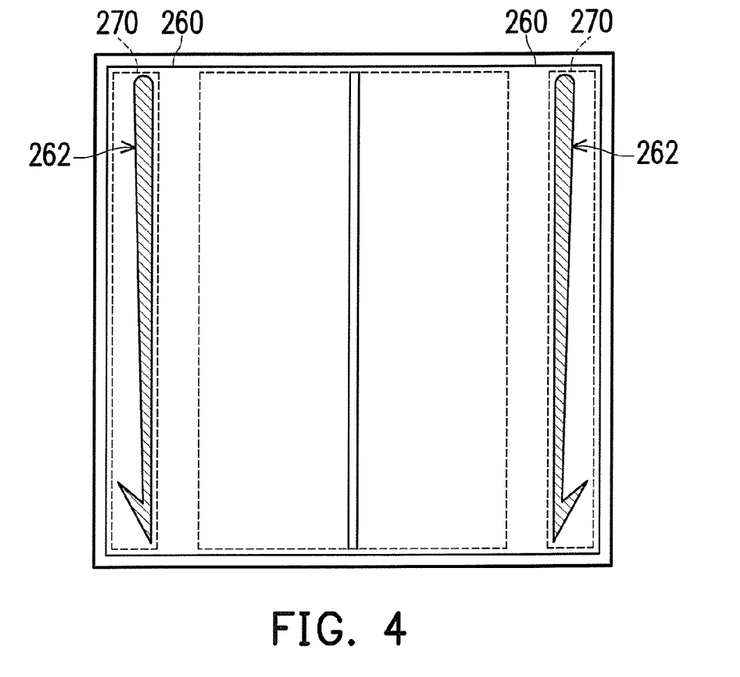
FIG. 4 is a top schematic view of a patterned insulating layer of a flip chip type laser diode according to an embodiment of the invention.

Of course, in other embodiments, a symbol may be used to indicate the laser emitting direction. FIG. 4 is a top schematic view of a patterned insulating layer of a flip chip type laser diode according to an embodiment of the invention. Referring to FIG. 4, hollow areas 262 where a patterned insulating layer 260 below two first electrodes 270 is removed display arrow signs to indicate the laser emitting direction in FIG. 4. The embodiments above are only provided to illustrate two letter strings or symbols that may be indicated. The manufacturer may determine the area where the patterned insulating layer 260 below the first electrodes 270 is removed to display specific information, and the invention is not limited the examples described herein.

Figure 5:
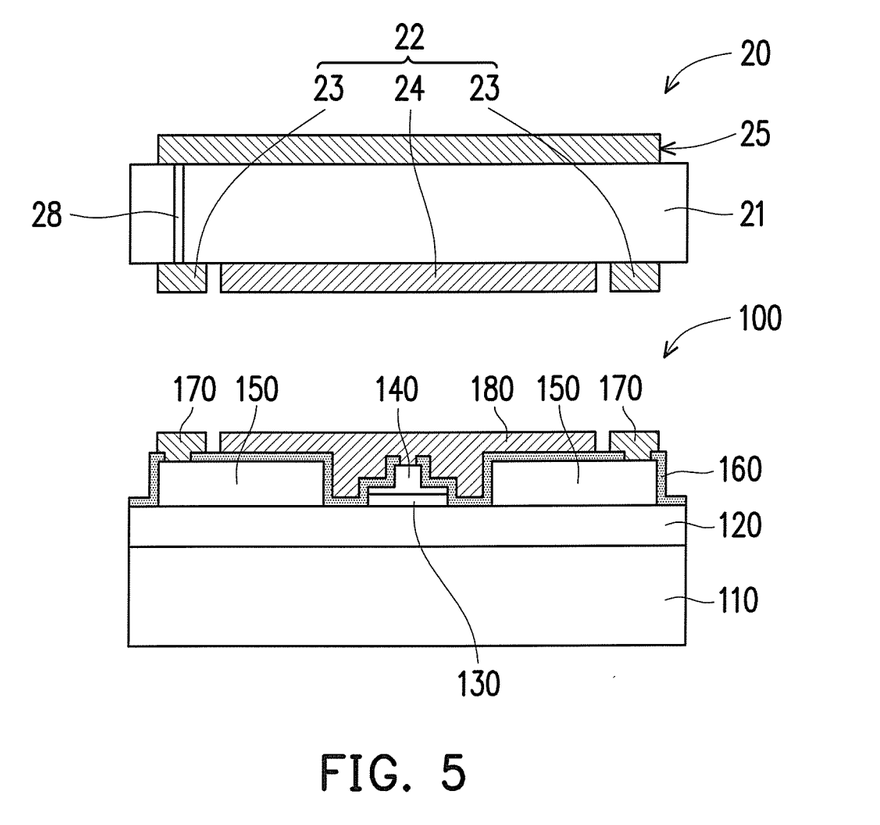
FIG. 5 is a cross-sectional schematic view illustrating the flip chip type laser diode shown in FIG. 2 and a package substrate.
Figure 6:
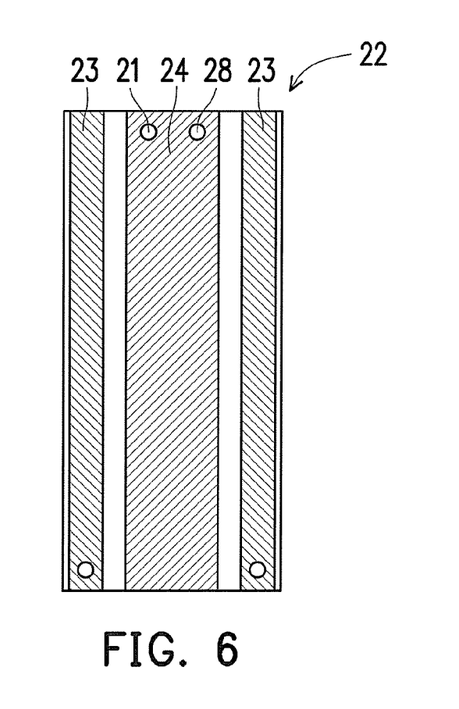
FIG. 6 is a schematic view illustrating a first patterned conductive layer of the package substrate shown in FIG. 5.
Figure 7:
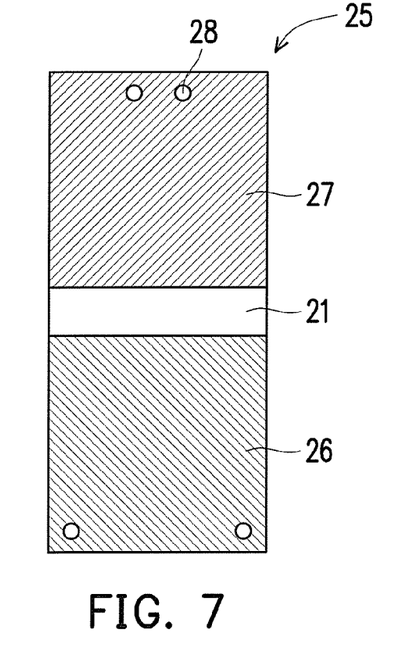
FIG. 7 is a schematic view illustrating a second patterned conductive layer of the package substrate shown in FIG. 5.

FIG. 5 is a cross-sectional schematic view illustrating the flip chip type laser diode shown in FIG. 2 and a package substrate. FIG. 6 is a schematic view illustrating a first patterned conductive layer of the package substrate shown in FIG. 5. FIG. 7 is a schematic view illustrating a second patterned conductive layer of the package substrate shown in FIG. 5. Referring to FIGS. 5-7, in this embodiment, the first electrodes 170 and the second electrode 180 of the flip chip type laser diode 100 are electrically connected with a package substrate 20. Specifically, the package substrate 20 includes a second substrate 21, a first patterned conductive layer 22 located at one side of the second substrate 21, and a second patterned conductive layer 25 located at the other side of the second substrate 21.

In this embodiment, a material of the second substrate 21 may be AlN. However, the invention is not limited thereto, as long as the material has a high thermal conductivity. The first patterned conductive layer 22 includes at least one third electrode 23 and a fourth electrode 24. The third electrode 23 is an N-type electrode, and the fourth electrode 24 is a P-type electrode. The number of the third electrode 23 is the same as that of the first electrode 170. In this embodiment, the number of the third electrode 23 is two, the third electrodes 23 may respectively contact the first electrodes 170, and the fourth electrode 24 contacts the second electrode 180.

The second patterned conductive layer 25 includes a fifth electrode 26 and a sixth electrode 27. In this embodiment, the fifth electrode 25 is an N-type electrode, and the sixth electrode 26 may be a P-type electrode. The second substrate 21 has a plurality of through vias 28 to electrically connect the third electrodes 23 at one side of the second substrate 21 to the fifth electrode 26 at the other side, and the fourth electrode 24 is electrically connected with the sixth electrode 27. In this embodiment, to allow the user to conveniently electrically connect the package structure after bonding of the flip chip type laser diode 100 and the package substrate 20, the through vias 28 are deliberately disposed to re-arrange the numbers of N-type and P-type electrodes, such that only one N-type electrode and one P-type electrode are disposed at a side (referring to the second patterned conductive layer 25 here) of the package substrate 20 facing outside. However, in other embodiments, the number of electrodes on the second patterned conductive layer 25 may be more than two. The invention is not limited thereto.

Figure 8:
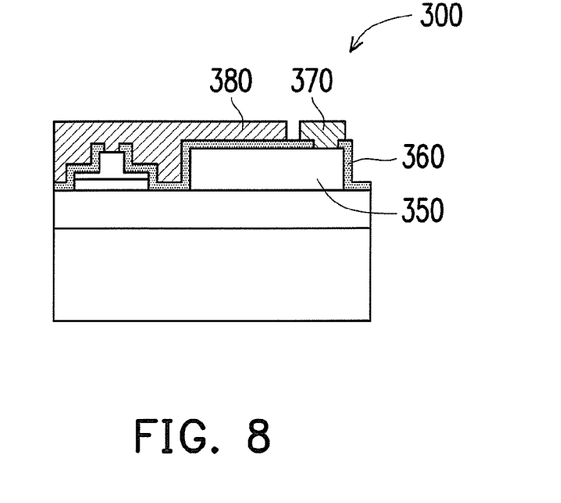
FIG. 8 is a cross-sectional schematic view illustrating a type laser diode according to another embodiment of the invention.

FIG. 8 is a cross-sectional schematic view illustrating a laser diode according to another embodiment of the invention. Referring to FIG. 8, a laser diode 300 of FIG. 8 mainly differs from the laser diode 100 shown in FIG. 2 in that, in FIG. 2, the laser diode 100 has two current conducting layers 150 and two first electrodes 170, and the two current conducting layers 150 and the two first electrodes 170 are disposed at the two sides of the ridge mesa and the second electrode 180. In FIG. 8, the laser diode 300 only has one current conducting layer 350 and a first electrode 370. The current conducting layer 350 and the first electrode 370 are disposed at one side of the ridge mesa and a second electrode 380.

Similarly, in this embodiment, the laser diode 300 can be the flip chip design which allows the first electrode 370 and the second electrode 380 to be directly bonded to a package substrate (not shown), such that heat generated during operation of the flip chip type laser diode 300 may be transmitted to the package substrate and be released. In addition, since the heat generated during the operation of the flip chip type laser diode 300 is accumulated at the ridge mesa, the flip chip type laser diode 300 of this embodiment is deliberately designed to dispose an area of each of the current conducting layer 350 that is not covered by the patterned insulating layer 360 at a position away from the ridge mesa, such that the second electrode 380 may have a greater size. In this way, the heat may be transmitted out of the flip chip type laser diode 300 through the second electrode 380 having a large area. However, the laser diode 300 can be a lateral chip type laser diode, which is not limited.

Figure 9:
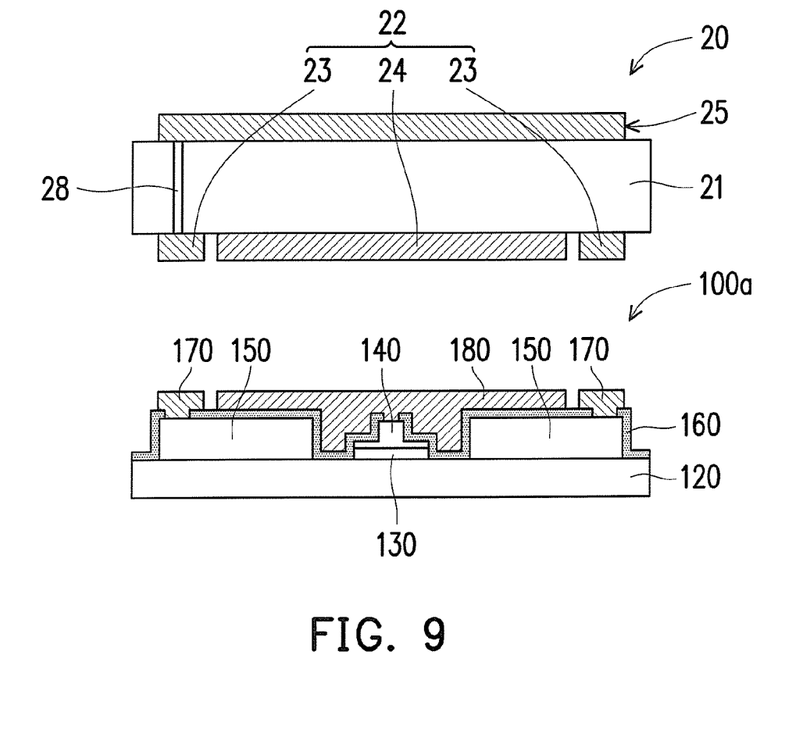
FIG. 9 is a cross-sectional schematic view illustrating a flip chip type laser diode according to an embodiment of the invention and a package substrate.

FIG. 9 is a cross-sectional schematic view illustrating a flip chip type laser diode according to an embodiment of the invention and a package substrate. In FIG. 9, the elements which are the same as or similar to the elements of FIG. 5 use the same or similar numbers of FIG. 5 to express, and the description of the elements is not repeated here. Referring to FIG. 9, a flip chip type laser diode 100a of FIG. 9 mainly differs from the flip chip type laser diode 100 shown in FIG. 5 in that, in FIG. 5, the flip chip type laser diode 100 has the removable substrate 110. In FIG. 9, the laser diode 100a do not have the removable substrate 110.

In the embodiment, without the removable substrate 110 (shown in FIG. 5), heat generated from the emitting layer 130 of the flip chip type laser diode 100a is capable of transmitting to outside more quickly instead of storing in the emitting layer 130. Therefore, the flip chip type laser diode 100a provides better working efficiency. In addition, the flip chip type laser diode 100a of FIG. 9 can be formed by removing the removable substrate 110 from the removable substrate 110 of FIG. 2 via LLQ or CMP technology after bonding, but the removing method is not limited thereto.

In view of the foregoing, the laser diode according to the embodiments of the invention may be bonded to the package substrate by direct bonding through the first and second electrodes. A material having a preferable heat dissipation property may be chosen for the second substrate of the package substrate, such that the heat generated by the flip chip type laser diode may be transmitted to the package substrate through the second electrode having a large area, thereby improving a heat dissipation efficiency. In addition, the flip chip type laser diode according to the embodiments of the invention is designed to dispose the current conducting layers at the two sides of the ridge mesa, such that the currents may flow toward the two sides to be evenly transmitted with a low resistance. The working efficiency is thus improved. Moreover, the electrodes of the flip chip type laser diode according to the embodiments of the invention are designed to approximately to reduce the issue of disconnection, and the device reliability is consequently improved efficiently. In additional, a lateral chip type laser diode according to the embodiments of the invention whose electrodes are designed to approximately coplanar is provided, such that the bonding defect-free rate is improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A flip chip type laser diode, comprising:
   a removable substrate;
   a first semiconductor layer, disposed on the removable substrate;
   an emitting layer, disposed on a part of the first semiconductor layer;
   a second semiconductor layer, disposed on the emitting layer and forming a ridge mesa;
   at least one current conducting layer, disposed on a part of the first semiconductor layer, wherein the at least one current conducting layer is electrically connected with the first semiconductor layer and isolated from the second semiconductor layer;
   a patterned insulating layer, covering the first semiconductor layer, the emitting layer, the second semiconductor layer, and the at least one current conducting layer, and exposing a part of the second semiconductor layer and a part of the at least one current conducting layer;
   at least one first electrode, disposed on an area of the at least one current conducting layer that is not covered by the patterned insulating layer; and
   a second electrode, disposed on an area of the second semiconductor layer that is not covered by the patterned insulating layer.

2. The flip chip type laser diode as claimed in claim 1, wherein the number of the at least one current conducting layer is two, and the two current conducting layers are located at two sides of the ridge mesa.

3. The flip chip type laser diode as claimed in claim 2, wherein the number of the at least one first electrode is two, and the two first electrodes are located at two sides of the second electrode.

4. The flip chip type laser diode as claimed in claim 1, wherein the removable substrate is a non-conductive substrate.

5. The flip chip type laser diode as claimed in claim 1, wherein a size of the second electrode is greater than a size of each of the first electrode.

6. The flip chip type laser diode as claimed in claim 1, wherein the second electrode covers the second semiconductor layer and a part of the patterned insulating layer, and the part of the patterned insulating layer covers a part of the first semiconductor layer and a part of the at least one current conducting layer.

7. The flip chip type laser diode as claimed in claim 1, wherein an area of the at least one current conducting layer that is not covered by the patterned insulating layer is away from the ridge mesa.

8. The flip chip type laser diode as claimed in claim 1, wherein a part of an area of the patterned insulating layer above the at least one current conducting layer is removed to display a specific letter string or symbol.

9. The flip chip type laser diode as claimed in claim 1, wherein the at least one first electrode and the second electrode are electrically connected with a package substrate, and the package substrate comprises a second substrate and a first patterned conductive layer located at one side of the second substrate.

10. The flip chip type laser diode as claimed in claim 9, wherein the first patterned conductive layer comprises at least one third electrode and a fourth electrode, the at least one third electrode contacts the at least one first electrode, and the fourth electrode contacts the second electrode.

11. The flip chip type laser diode as claimed in claim 10, wherein the package substrate comprises a second patterned conductive layer located at the other side of the second substrate, the second patterned conductive layer comprises a fifth electrode and a sixth electrode, the second substrate has a plurality of through vias, making the at least one third electrode electrically connected to the fifth electrode, and the fourth electrode electrically connected to the sixth electrode.

12. The flip chip type laser diode as claimed in claim 1, wherein a first surface of the at least one first electrode away from the at least one current conducting layer and a second surface of the second electrode away from the second semiconductor layer are approximately coplanar.

13. A lateral chip type laser diode, comprising:
    a removable substrate;
    a first semiconductor layer, disposed on the removable substrate;
    an emitting layer, disposed on a part of the first semiconductor layer;
    a second semiconductor layer, disposed on the emitting layer and forming a ridge mesa;
    at least one current conducting layer, disposed on a part of the first semiconductor layer, wherein the at least one current conducting layer is electrically connected with the first semiconductor layer and isolated from the second semiconductor layer;
    a patterned insulating layer, covering the first semiconductor layer, the emitting layer, the second semiconductor layer, and the at least one current conducting layer, and exposing a part of the second semiconductor layer and a part of the at least one current conducting layer;
    at least one first electrode, disposed on an area of the at least one current conducting layer that is not covered by the patterned insulating layer; and
    a second electrode, disposed on an area of the second semiconductor layer that is not covered by the patterned insulating layer, wherein a first surface of the at least one first electrode away from the at least one current conducting layer and a second surface of the second electrode away from the second semiconductor layer are approximately coplanar.

* * * * *